(12) United States Patent
Endo

(10) Patent No.: US 8,988,405 B2
(45) Date of Patent: Mar. 24, 2015

(54) DISPLAY DEVICE AND SEMICONDUCTOR DEVICE

(75) Inventor: Masami Endo, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 564 days.

(21) Appl. No.: 12/908,299

(22) Filed: Oct. 20, 2010

(65) Prior Publication Data

US 2011/0096047 A1 Apr. 28, 2011

(30) Foreign Application Priority Data

Oct. 26, 2009 (JP) ................................ 2009-245532

(51) Int. Cl.
*G06F 3/038* (2013.01)
*G09G 5/00* (2006.01)
*G01J 1/04* (2006.01)
*G01J 1/32* (2006.01)
*H05B 33/08* (2006.01)
(Continued)

(52) U.S. Cl.
CPC .... *G01J 1/04* (2013.01); *G01J 1/32* (2013.01); *H05B 33/0872* (2013.01); *H05B 37/0218* (2013.01); *G06F 3/0412* (2013.01); *G06F 3/042* (2013.01); *H04N 1/00129* (2013.01); *Y02B 20/46* (2013.01); *G02F 1/13318* (2013.01); *G02F 2001/13312* (2013.01); *G02F 2001/133626* (2013.01); *G02F 2001/136281* (2013.01); *G02F 2001/136295* (2013.01); *G02F 2001/13793* (2013.01); *G02F 2201/58* (2013.01); *G02F 2203/30* (2013.01); *G02F 2203/68* (2013.01); *H01L 27/3227* (2013.01); *G09G 2360/148* (2013.01)

USPC ............................ 345/207; 345/204; 345/102

(58) Field of Classification Search
CPC ................. G02F 1/13318; G02F 2001/133626
USPC .................................................... 345/102, 204
See application file for complete search history.

(56) References Cited

U.S. PATENT DOCUMENTS 5,873,070 A 2/1999 Bunte et al.
6,295,138 B1 * 9/2001 Kitagawa et al. .............. 358/1.9
(Continued)

FOREIGN PATENT DOCUMENTS

JP 06-066900 B 8/1994
JP 2000-152082 5/2000
(Continued)

OTHER PUBLICATIONS

Tanaka et al., "A CG Silicon System LCD With Multi-Mode Optical Input Function", AM-FPD '08, Digest of Technical Papers, pp. 89-92 Jul. 2, 2008.

*Primary Examiner* — Viet Pham
(74) *Attorney, Agent, or Firm* — Nixon Peabody LLP; Jeffrey L. Costellia

(57) ABSTRACT

An object is to detect reflected light from an object accurately and to improve accuracy of capturing an image in a photosensor included in a display panel. In the display panel including a photosensor, when an image of an object is captured, light is emitted from a light source to the object and reflected light enters the photosensor. In the case where the incident light is too strong with respect to sensitivity of the photosensor, luminance of the light source is lowered. In the case where the incident light is too weak with respect to sensitivity of the photosensor, the luminance of the light source is increased.

34 Claims, 12 Drawing Sheets

(51) Int. Cl.
    *H05B 37/02*         (2006.01)
    *G06F 3/041*         (2006.01)
    *G06F 3/042*         (2006.01)
    *H04N 1/00*          (2006.01)
    *G02F 1/133*         (2006.01)
    *G02F 1/1335*       (2006.01)
    *G02F 1/1362*       (2006.01)
    *G02F 1/137*         (2006.01)
    *H01L 27/32*         (2006.01)

(56) References Cited

U.S. PATENT DOCUMENTS

| | | |
|---|---|---|
| 6,542,105 B2 | 4/2003 | Sakuragi |
| 6,638,781 B1 | 10/2003 | Hirakata et al. |
| 6,692,984 B2 | 2/2004 | Yonezawa et al. |
| 6,717,359 B2 | 4/2004 | Kimura |
| 6,724,012 B2 | 4/2004 | Kimura |
| 6,747,290 B2 | 6/2004 | Yamazaki et al. |
| 6,747,638 B2 | 6/2004 | Yamazaki et al. |
| 6,825,492 B2 | 11/2004 | Yonezawa et al. |
| 7,068,254 B2 | 6/2006 | Yamazaki et al. |
| 7,161,185 B2 | 1/2007 | Yamazaki et al. |
| 7,173,281 B2 | 2/2007 | Hirakata et al. |
| 7,224,391 B2 | 5/2007 | Kimura |
| 7,321,672 B2 | 1/2008 | Sasaki et al. |
| 7,342,256 B2 | 3/2008 | Yamazaki |
| 7,351,605 B2 | 4/2008 | Yonezawa et al. |
| 7,365,750 B2 | 4/2008 | Yamazaki et al. |
| 7,369,114 B2 | 5/2008 | Arakawa |
| 7,397,064 B2 | 7/2008 | Yamazaki et al. |
| 7,427,223 B2 | 9/2008 | Kimura |
| 7,525,523 B2 | 4/2009 | Yamazaki et al. |
| 7,570,246 B2 | 8/2009 | Maniam et al. |
| 7,586,479 B2 | 9/2009 | Park et al. |
| 7,605,902 B2 | 10/2009 | Hirakata et al. |
| 7,750,345 B2 | 7/2010 | Tanada |
| 7,751,600 B2 | 7/2010 | Yamazaki et al. |
| 7,787,039 B2 | 8/2010 | Kimura |
| 7,804,479 B2 | 9/2010 | Furukawa et al. |
| 7,808,009 B2 | 10/2010 | Hirakata et al. |
| 7,964,879 B2 | 6/2011 | Yamazaki |
| 7,973,471 B2 | 7/2011 | Kimura |
| 7,999,269 B2 | 8/2011 | Miyao et al. |
| 8,148,236 B2 | 4/2012 | Takahashi et al. |
| 8,154,523 B2 | 4/2012 | Miller et al. |
| 8,184,090 B2 | 5/2012 | Sato et al. |
| 8,482,484 B2 | 7/2013 | Yamazaki et al. |
| 2004/0189567 A1 | 9/2004 | Kimura |
| 2005/0030264 A1 | 2/2005 | Tsuge et al. |
| 2005/0219229 A1 | 10/2005 | Yamaguchi |
| 2005/0275616 A1* | 12/2005 | Park et al. .............. 345/102 |
| 2006/0119590 A1 | 6/2006 | Park et al. |
| 2006/0220077 A1 | 10/2006 | Hayashi et al. |
| 2007/0126656 A1* | 6/2007 | Huang et al. ............ 345/46 |
| 2008/0054163 A1* | 3/2008 | Suzunaga ................ 250/214 A |
| 2008/0170028 A1 | 7/2008 | Yoshida |
| 2008/0259051 A1* | 10/2008 | Ota ......................... 345/175 |
| 2008/0266238 A1* | 10/2008 | Lv .......................... 345/102 |
| 2008/0284710 A1 | 11/2008 | Kimura et al. |
| 2008/0284768 A1 | 11/2008 | Yoshida et al. |
| 2008/0309611 A1* | 12/2008 | Yang ...................... 345/102 |
| 2009/0003699 A1 | 1/2009 | Dugan et al. |
| 2009/0088209 A1 | 4/2009 | Atkinson et al. |
| 2009/0114926 A1 | 5/2009 | Yamazaki |
| 2009/0128529 A1 | 5/2009 | Izumi et al. |
| 2009/0141004 A1 | 6/2009 | Yamazaki |
| 2009/0195511 A1 | 8/2009 | Cites et al. |
| 2010/0007632 A1 | 1/2010 | Yamazaki |
| 2010/0085331 A1 | 4/2010 | Kurokawa et al. |
| 2010/0156850 A1 | 6/2010 | Kurokawa |
| 2010/0156851 A1 | 6/2010 | Kurokawa |

FOREIGN PATENT DOCUMENTS

| | | |
|---|---|---|
| JP | 2001-268322 A | 9/2001 |
| JP | 2001-292276 | 10/2001 |
| JP | 2002-182839 | 6/2002 |
| JP | 2002-217733 | 8/2002 |
| JP | 2002-251164 | 9/2002 |
| JP | 2003-167550 | 6/2003 |
| JP | 2005-276030 A | 10/2005 |
| JP | 2007-183706 | 7/2007 |
| JP | 2008-242468 | 10/2008 |
| JP | 2008-287702 A | 11/2008 |

* cited by examiner

| A:32 | B:48 | C:48 |
| --- | --- | --- |
| D:56 | E:56 | F:60 |
| G:60 | H:62 | I:63 |

| Bit \ Pixel | A | B | C | D | E | F | G | H | I | Bit Count Number |
| --- | --- | --- | --- | --- | --- | --- | --- | --- | --- | --- |
| 6 | 1 | 1 | 1 | 1 | 1 | 1 | 1 | 1 | 1 | 9 |
| 5 | 0 | 1 | 1 | 1 | 1 | 1 | 1 | 1 | 1 | 8 |
| 4 | 0 | 0 | 0 | 1 | 1 | 1 | 1 | 1 | 1 | 6 |
| 3 | 0 | 0 | 0 | 0 | 0 | 1 | 1 | 1 | 1 | 4 |
| 2 | 0 | 0 | 0 | 0 | 0 | 0 | 0 | 1 | 1 | 2 |
| 1 | 0 | 0 | 0 | 0 | 0 | 0 | 0 | 0 | 1 | 1 |

| A:1 | B:1 | C:3 |
| --- | --- | --- |
| D:7 | E:7 | F:15 |
| G:15 | H:15 | I:63 |

| Bit \ Pixel | A | B | C | D | E | F | G | H | I | Bit Count Number |
| --- | --- | --- | --- | --- | --- | --- | --- | --- | --- | --- |
| 6 | 0 | 0 | 0 | 0 | 0 | 0 | 0 | 0 | 1 | 1 |
| 5 | 0 | 0 | 0 | 0 | 0 | 0 | 0 | 0 | 1 | 1 |
| 4 | 0 | 0 | 0 | 0 | 0 | 1 | 1 | 1 | 1 | 4 |
| 3 | 0 | 0 | 0 | 1 | 1 | 1 | 1 | 1 | 1 | 6 |
| 2 | 0 | 0 | 1 | 1 | 1 | 1 | 1 | 1 | 1 | 7 |
| 1 | 1 | 1 | 1 | 1 | 1 | 1 | 1 | 1 | 1 | 9 |

| A:63 | B:63 | C:63 |
|---|---|---|
| D:63 | E:63 | F:63 |
| G:63 | H:62 | I:56 |

| Pixel / Bit | A | B | C | D | E | F | G | H | I | Bit Count Number |
|---|---|---|---|---|---|---|---|---|---|---|
| 6 | 1 | 1 | 1 | 1 | 1 | 1 | 1 | 1 | 1 | 9 |
| 5 | 1 | 1 | 1 | 1 | 1 | 1 | 1 | 1 | 1 | 9 |
| 4 | 1 | 1 | 1 | 1 | 1 | 1 | 1 | 1 | 1 | 9 |
| 3 | 1 | 1 | 1 | 1 | 1 | 1 | 1 | 1 | 0 | 8 |
| 2 | 1 | 1 | 1 | 1 | 1 | 1 | 1 | 1 | 0 | 8 |
| 1 | 1 | 1 | 1 | 1 | 1 | 1 | 1 | 0 | 0 | 7 |

| A:63 | B:0 | C:0 |
|---|---|---|
| D:0 | E:0 | F:0 |
| G:0 | H:0 | I:0 |

| Bit \ Pixel | A | B | C | D | E | F | G | H | I | Bit Count Number |
|---|---|---|---|---|---|---|---|---|---|---|
| 6 | 1 | 0 | 0 | 0 | 0 | 0 | 0 | 0 | 0 | 1 |
| 5 | 1 | 0 | 0 | 0 | 0 | 0 | 0 | 0 | 0 | 1 |
| 4 | 1 | 0 | 0 | 0 | 0 | 0 | 0 | 0 | 0 | 1 |
| 3 | 1 | 0 | 0 | 0 | 0 | 0 | 0 | 0 | 0 | 1 |
| 2 | 1 | 0 | 0 | 0 | 0 | 0 | 0 | 0 | 0 | 1 |
| 1 | 1 | 0 | 0 | 0 | 0 | 0 | 0 | 0 | 0 | 1 |

DISPLAY DEVICE AND SEMICONDUCTOR DEVICE

BACKGROUND OF THE INVENTION

1. Field of the Invention

The technical field of the present invention relates to a display device and a semiconductor device, a method for driving the same, and a method for manufacturing the same.

2. Description of the Related Art

In recent years, a display panel provided with a touch sensor has attracted attention. The touch sensor is classified by principle of operation under resistive touch sensors, capacitive touch sensors, optical touch sensors, and the like. In any of the sensors, an object is in contact with a display panel or in the vicinity of the display panel, whereby data can be input.

A display screen also serves as an input region by provision of a sensor (also referred to as a photosensor or a photoelectric conversion element) which detects light, as an optical touch sensor for a display panel.

In a display panel provided with a photosensor, light is emitted from the display panel to an object. The emitted light is reflected by the object to enter the photosensor. The photosensor generates current in accordance with luminance of the received light and data of an image of the object is obtained as electrical data.

As an example of a device provided with such a display panel, a display device having an image capturing function, that is, a so-called scanner function, which is provided with an area sensor that captures an image of an object, is given (e.g., see Patent Document 1).

Further, a technique for personal authentication with a touch sensor provided in a device which does not necessarily have a display panel, such as a fingerprint authentication device, has been proposed.

REFERENCE

[Patent Document 1] Japanese Published Patent Application No. 2001-292276

SUMMARY OF THE INVENTION

In the display panel disclosed in Patent Document 1, light reflected from an object is not suitable for sensitivity of the photosensor when the light is too bright, too dim, or the like, causing a problem in that an image of the object is not precisely captured. Excess brightness of the captured image occurs in the case where the light is too bright and poor brightness of the captured image occurs in the case where the light is too dim. In either case, the captured image is unclear.

In view of the above problems, an object is to improve accuracy of capturing an image in a data input portion such as a display panel.

A semiconductor device disclosed in this specification has a feature of adjusting light of a light source so that a reflected light from an object is suitable for sensitivity of a photosensor when the semiconductor device captures an image of the object in an input portion including the photosensor. Note that a semiconductor device may be a device including a display panel (also referred to as a display device) or may be a device without display panel.

Specifically, luminance of the light source is lowered in the case where incident light is too strong with respect to the sensitivity of the photosensor. On the contrary, the luminance of the light source is increased in the case where the incident light is too weak. By adjusting the luminance of the light source, luminance of the light reflected from the object is adjusted and luminance of the light incident on the photosensor can be adjusted.

When a display element of a display panel is a non-light-emitting element such as a liquid crystal element, a light source is a backlight and luminance of light incident on the photosensor is adjusted by adjusting luminance of the backlight.

When a display element of a display panel is a light-emitting element such as an EL element, a light source is the light-emitting element and luminance of light incident on the photosensor is adjusted by adjusting luminance of the light-emitting element.

Further, in the case of a device without a display panel, a light source is provided and luminance of light incident on the photosensor is adjusted by adjusting luminance of the light source.

One embodiment of the present invention is a semiconductor device including an input portion including a photosensor, a light source, an A/D converter, a bit count measurement portion, and a controller. The input portion includes a unit for capturing an image of an object when light from the light source is reflected by the object and the reflected light is received by the photosensor. The A/D converter includes a unit for converting image data of the image of the object into a digital signal. The bit count measurement portion includes a unit for measuring a bit count number of each bit of the digital signal. The controller includes a unit for adjusting luminance of the light source in accordance with the bit count number.

Another embodiment of the present invention is a display device including a display panel including a photosensor, a backlight, an A/D converter, a bit count measurement portion, and a controller. The display panel includes a unit for capturing an image of an object when light from the backlight is reflected by the object and the reflected light is received by the photosensor. The A/D converter includes a unit for converting image data of the image of the object into a digital signal. The bit count measurement portion includes a unit for measuring a bit count number of each bit of the digital signal. The controller includes a unit for adjusting luminance of the backlight in accordance with the bit count number.

Another embodiment of the present invention is a display device including a display panel including a photosensor, a backlight, an A/D converter, a bit count measurement portion, and a controller. The display panel includes a unit for capturing an image of an object when light from the backlight is reflected by the object and the reflected light is received by the photosensor. The A/D converter includes a unit for converting image data of the image of the object into a digital signal. The bit count measurement portion includes a unit for measuring a bit count number of each bit of the digital signal and a unit for judging whether or not the received light is suitable for sensitivity of the photosensor in accordance with distribution of the bit count numbers. The controller includes a unit for adjusting luminance of the backlight in accordance with a judgment result.

Another embodiment of the present invention is a display device including a display panel including a photosensor, a backlight, an A/D converter, a bit count measurement portion, and a controller. The display panel includes a unit for capturing an image of an object when light from the backlight is reflected by the object and the reflected light is received by the photosensor. The A/D converter includes a unit for converting image data of the image of the object into a digital signal. The bit count measurement portion includes a unit for measuring a bit count number of each bit of the digital signal and a unit for judging whether or not the received light is suitable for sensitivity of the photosensor in accordance with distribution of the bit count numbers. The controller includes a unit for adjusting luminance of the backlight so that a peak of the bit count numbers comes to a central bit in distribution of the bit count numbers.

Another embodiment of the present invention is a display device including a display panel including a photosensor, a backlight, an A/D converter, a bit count measurement portion, and a controller. The display panel includes a unit for capturing an image of an object when light from the backlight is reflected by the object and the reflected light is received by the photosensor. The A/D converter includes a unit for converting image data of the image of the object into a digital signal. The bit count measurement portion includes a unit for measuring a bit count number of each bit of the digital signal and a unit for judging whether or not the received light is suitable for sensitivity of the photosensor in accordance with distribution of the bit count numbers. The controller includes a unit for adjusting luminance of the backlight so that an average of the bit count numbers of respective bits comes to a medium value of a maximum value of the bit count numbers in distribution of the bit count numbers.

A light source can be adjusted to be suitable for sensitivity of a photosensor, so that a captured image can be clear.

Further, the light source can be adjusted in accordance with a color and brightness of an object, so that an image which is closer to the real object can be captured.

A variety of processing can be performed with the captured image. In the case where a text or a drawing is captured, they are stored as electronic data and displayed when necessary. Further, in the case where a fingerprint or the like is captured, personal authentication or the like can be performed.

The image becomes clear, whereby a touched position can be accurately determined and incorrect input can be prevented.

DETAILED DESCRIPTION OF THE INVENTION

Figure 1:
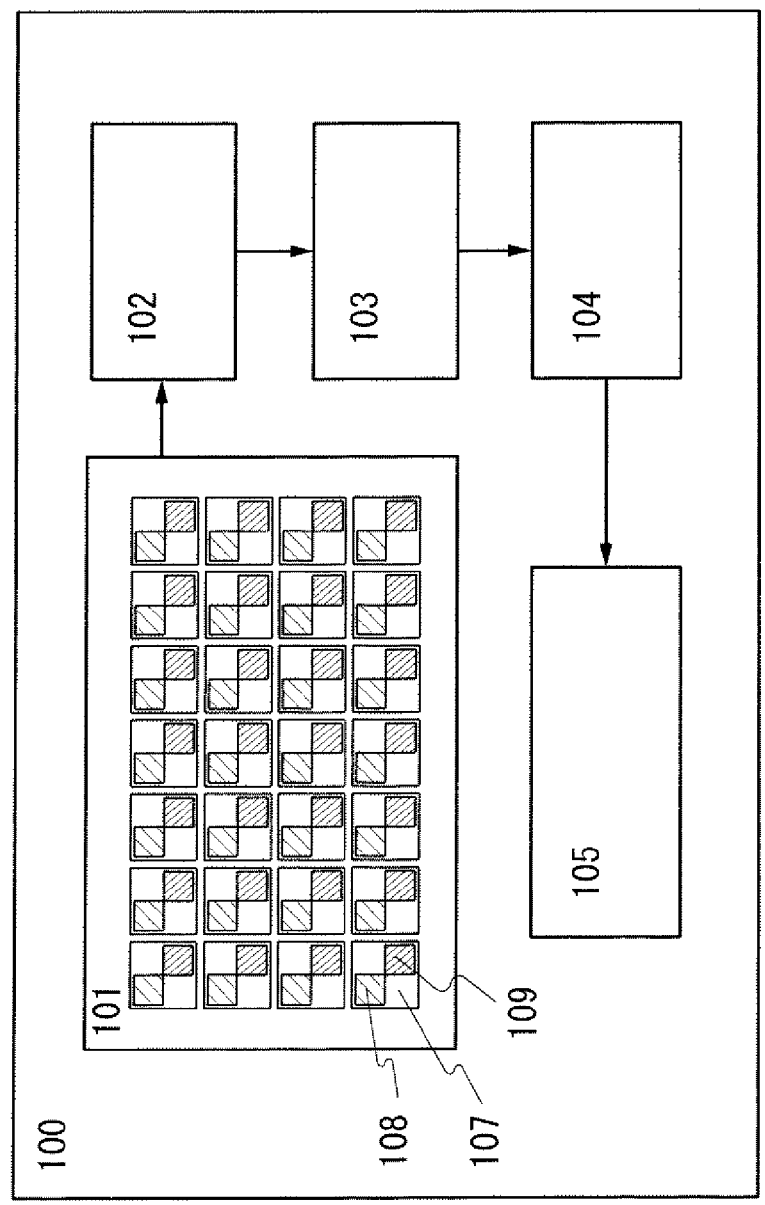
FIG. 1 illustrates a structure of a display panel.

The embodiments will be described with reference to the drawings. Note that the present invention is not limited to the description given below. It is easily understood by those skilled in the art that modes and details disclosed herein can be modified in various ways without departing from the spirit and the scope of the present invention. Therefore, the invention should not be construed as being limited to the description in the following embodiments. Note that in structures of the present invention described hereinafter, the same portions or portions having similar functions are denoted by the same reference numerals in different drawings, and description thereof is not repeated.

(Embodiment 1)

A display device including a display panel and operation thereof will be described with reference to FIG. 1. FIGS. 2A to 2C, and FIGS. 3A to 3C in Embodiment 1.

FIG. 1 is an example of a display device including a display panel.

A display device 100 includes a display panel 101, an analog-digital converter (A/D converter) 102, a bit count measurement portion 103, a controller 104, and a backlight portion 105. A structure of the display device illustrated here is merely an example and a structure is not limited to this. As another example, part of or all of the A/D converter 102, the bit count measurement portion 103, the controller 104, and the backlight portion 105 may be integrally formed in the display panel 101.

The display panel 101 includes a plurality of pixels 107 arranged in matrix. A display element 108 and a photosensor 109 are arranged in each pixel 107. The display element 108 is a non-light-emitting element such as a liquid crystal element. The photosensor 109 is a light-receiving element such as a photo diode. Note that the display panel 101 may include a circuit for controlling the display element and a circuit for driving the photosensor.

The display panel 101 has a function of displaying an image. The display element 108 of each pixel 107 is controlled and light from the backlight portion 105 passes through a desired pixel; thus, an image is displayed.

Further, the display panel 101 has a function of capturing an image of an object, namely a scanning function. Capturing an image is performed in the following manner. Light is emitted from the backlight portion 105 to the object when the object touches or approaches the display panel 101. Then, the emitted light is reflected by the object and enters the photosensor 109 provided in each pixel 107. The photosensor 109 generates current in accordance with luminance of the received light and image data of the object is obtained as an electrical signal.

The display device 100 has a function of adjusting light from the backlight portion 105 (light adjusting function) at a time when the display panel 101 displays an image and at a time when the display panel 101 captures an image. Adjusting light is performed in accordance with sensitivity of the photosensor 109 provided in the display panel 101.

A specific method for adjusting light from the backlight portion 105 in accordance with the sensitivity of the photosensor 109 will be described below with reference to FIG. 1, FIGS. 2A to 2C, and FIGS. 3A to 3C.

First, the display panel 101 captures an image of an object in the above-described manner. Any of what is desired to be captured can be used as appropriate, as the object, such as paper on which a letter or a picture is put, or a human finger.

The image is sent to the A/D converter 102 to be converted into a digital signal with n bits (FIG. 1). Digitization is performed in the following manner.

Figures 2A, 2B, 2C:
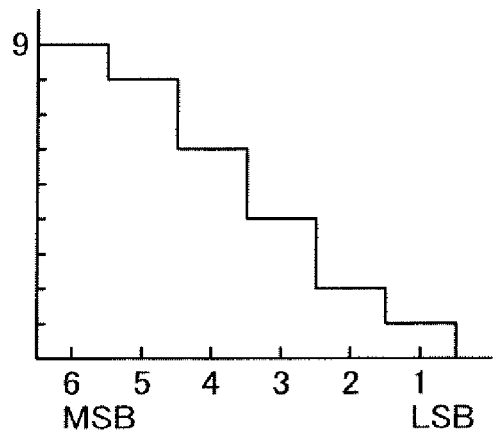
FIGS. 2A to 2C illustrate a method for analyzing image data.
Figures 3A, 3B, 3C:
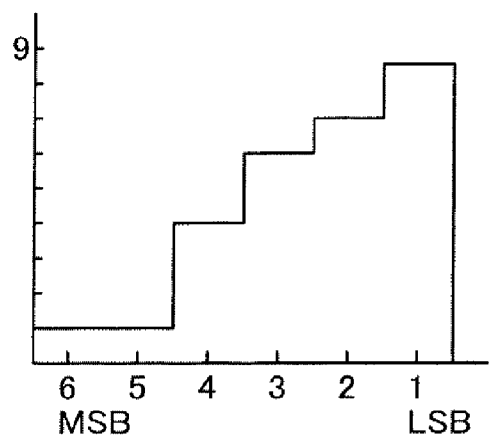
FIGS. 3A to 3C illustrate a method for analyzing image data.

First, luminance of each pixel is expressed by gray level. FIG. 2A is an example of gray level of each pixel, where the number of the pixels of a captured image is m=9 (3×3), and the number of bits is n=6 (64 gray levels).

Next, the gray level of each pixel is expressed as a bit value with 0 and 1.

For example, in the case of a pixel A, the gray level is $32=(1\times2^5)+(0\times2^4)+(0\times2^3)+(0\times2^2)+(0\times2^1)+(0\times2^0)$, that is, a sixth bit=1, a fifth bit=0, a fourth bit=0, a third bit=0, a second bit=0, and a first bit=0; accordingly, the bit values of the first to sixth bits are "100000". Although the sixth bit is the most significant bit (MSB) and the first bit is the least significant bit (LSB), the sixth bit may be LSB and the first bit may be MSB.

In the case of a pixel E, the gray scale is $56=(1\times2^5)+(1\times2^4)+(1\times2^3)+(0\times2^2)+(0\times2^1)+(0\times2^0)$, and thus the bit values of the first to sixth bits are "111000".

The gray levels of the other pixels are expressed as a bit value in a similar manner. The bit values of the first to sixth bits are shown in columns of the pixels A to I in FIG. 2B.

The image data expressed by the bit values is sent to the bit count measurement portion 103 (FIG. 1).

The bit count measurement portion 103 measures a bit count number of each of the first to sixth bits. The bit count number is a sum of the number of pixels having the bit value of 1 with respect to each bit. For example, in the case of the sixth bit, the nine pixels of the pixels A to I have the bit value of 1, so that the bit count number is 9. In the case of the fourth bit, the six pixels of the pixels D to I have the bit value of 1, so that the bit count number is 6.

The bit count numbers of the other bits are obtained in a similar manner. The bit count numbers of the respective bits are shown in cells on the right end column in FIG. 2B.

FIG. 2C shows distribution of the measured bit count numbers. A horizontal axis indicates a bit and a vertical axis indicates the bit count number.

Here, in the distribution as in FIG. 2C, in the case where a peak of the bit count numbers comes to a central bit, judgment is that light suitable for the sensitivity of the photosensor enters. In this embodiment, the central bit is the third bit or the fourth bit. The central bit of n bits is a (n/2)-th bit or a {(n/2)+1}-th bit in the case where n is an even number and a {(n+1)/2}-th bit in the case where n is an odd number.

In FIG. 2C, the distribution of the bit count numbers is inclined toward the sixth bit side (MSB side). In this case, the incident light is so strong that the light is judged not to be suitable for the sensitivity of the photosensor. After judgment, a judgment result of the bit count numbers is sent to the controller 104.

The controller 104 has a function of adjusting luminance of the backlight in accordance with the bit count numbers and sends a signal for controlling output of a backlight power source to the backlight portion 105. In the case of FIG. 2C, a signal for lowering the luminance of the backlight is sent so that the peak of the bit count numbers is moved to the central bit from the sixth bit.

The backlight portion 105 controls the output of the backlight power source in accordance with the signal of the controller 104 to adjust the light from the backlight. In the case of FIG. 2C, the luminance of the backlight is lowered.

The adjusted light is reflected by the object and received by the photosensor, so that the image is captured again. Measurement of the bit count numbers is performed again on the captured image. When the peak of the bit count numbers comes to the central bit, judgment is that the light is suitable for the sensitivity of the photosensor and capture of the image is completed. When the peak does not come to the central bit, similar operation may be performed again to adjust the light from the backlight.

In the example of the image data in FIGS. 2A to 2C, the case where the incident light is too strong is shown. The light from the backlight can be adjusted in a similar manner when an incident light is too weak. When measurement of the bit count numbers is similarly performed on image data in FIG. 3A (FIG. 3B), distribution is inclined toward the first bit side (LSB side) (FIG. 3C), which means that the incident light is too weak, so that the light is judged not to be suitable for the sensitivity of the photosensor. In this case, the controller 104 outputs a signal for increasing the luminance of the backlight, so that the luminance of the backlight is increased.

Thus, accuracy of capturing an image can be improved and a precise and clear image can be obtained. In particular, the structure in which the bit count numbers of the captured image are measured is used, whereby the light from the backlight can be adjusted in accordance with the captured image. Further, more accurate light adjustment is performed by increasing the number of bits (gray levels), which leads to further improvement in accuracy of capturing an image. In this embodiment, an example of a single color is described; however, when three colors of R, G, and B are used, light can be adjusted while the color of the captured image is judged.

Further, since capture of an image, A/D conversion, measurement of the bit count numbers, and adjustment of light from a backlight can be performed automatically, an optimal image can be automatically obtained at all time. A function of switching an automatic mode and a manual mode may be provided, and the two modes may be used in accordance with usage.

Although the number of pixels is 3×3 for simple description in this embodiment, the number of pixels may be set to 640×480 or the like for practical use. Further, a range of a central bit can be changed in accordance with a specification and variation caused in manufacture of a photosensor. Further, by making the range of the central bit wider, accuracy of capturing an image can be controlled.

A device including a display panel is described in this embodiment, but a device does not necessarily include a display panel. In that case, a semiconductor device is formed so that a photosensor is provided in a portion where an object to be detected touches or approaches (such a portion is also referred to as an input portion) and light of a light source is adjusted in a similar manner; thus, an image may be captured.

This embodiment can be implemented in appropriate combination with any of the other embodiments.

(Embodiment 2)

In this embodiment, a method for adjusting light from a backlight in the case where distribution of bit count numbers is flat will be described. Up to the measurement of the bit count number is similar to Embodiment 1. The number of pixels is 3×3, that is m=9, and the number of bits is n=6.

In this embodiment, flat distribution does not necessarily mean that all the bits have exactly the same bit count number. The flat distribution means the case where 80% or more of n bits are in a range "(average−standard deviation) to (average+standard deviation)" of the bit count number. For practical use, whether the distribution is flat or not may be judged in accordance with the number of pixels or a value of n.

Figures 4A, 4B, 4C:
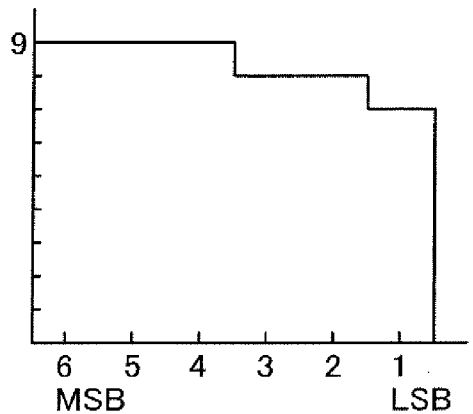
FIGS. 4A to 4C illustrate a method for analyzing image data.

As an example, when the bit count number of image data with gray levels shown in FIG. 4A is measured, the bit count number of the first bit is 7, the bit count numbers of the second and third bits are 8, the bit count numbers of the fourth to sixth bits are 9 as shown in FIG. 4B, and distribution as in FIG. 4C is observed. The average of the bit count numbers is 8.3 and the standard deviation is 0.82. Accordingly, "(average−standard deviation) to (average+standard deviation)" is in a range of 7.48 to 9.12. Among the six bits, the five bits of the second to sixth bits {(5/6)×100=83%} are within this range, so that the distribution in FIG. 4C is judged to be flat.

Here, in the case where distribution of the bit count numbers is flat, the light is judged to be suitable for the sensitivity of the photosensor when the average of the bit count numbers is a half of a maximum value. In this embodiment, the half of the maximum value is 4 or 5. A half of the maximum value of the bit count numbers is (m/2) with m of an even number or {(m−1)/2} or {(m+1)/2} with in of an odd number.

In FIG. 4C, the average of the bit count numbers is inclined toward the maximum value side. In this case, the incident light is too strong that the light is judged not to be suitable for the sensitivity of the photosensor. After judgment, a judgment result of the bit count numbers is sent to the controller 104.

As in Embodiment 1, the controller 104 sends a signal to the backlight portion 105 to adjust light of the backlight. In the case of FIG. 4C, the luminance of the backlight is lowered so that the average of the bit count numbers is set to 4 or 5 which is a half of the maximum value of 9.

Figures 5A, 5B, 5C:
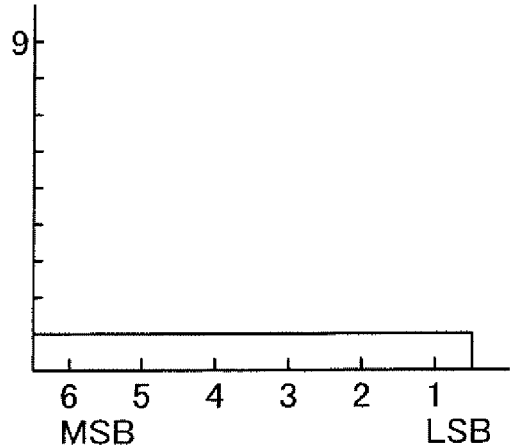
FIGS. 5A to 5C illustrate a method for analyzing image data.

In contrast, in the case where the average of the bit count numbers is inclined toward the minimum value side as in FIGS. 5A to 5C, the luminance of the backlight may be increased so that the average of the bit count numbers is set to 4 or 5 which is a half of the maximum value of 9.

Although the number of pixels is 3×3 for simple description in this embodiment, the number of pixels may be set to 640×480 or the like for practical use. In that case, since the maximum value of the bit count numbers is as large as 30720, the medium value is defined so as to lie within a range including 15360 which is a half of the maximum value. For example, the medium value is set within a range of 80% to 120% of 15360 which is the half of the value and light adjustment is performed so that the average is set to the medium value. By changing the range of the medium value, accuracy of capturing an image can be changed.

This embodiment can be implemented in appropriate combination with any of the other embodiments.

(Embodiment 3)

In this embodiment, in a display device including the display panel described in Embodiment 1 or 2, the case where a display element includes a light-emitting element such as an EL element will be described.

In a display device including a light-emitting element as a display element, the light-emitting element serves as a light source and emits light to an object.

Figure 6:
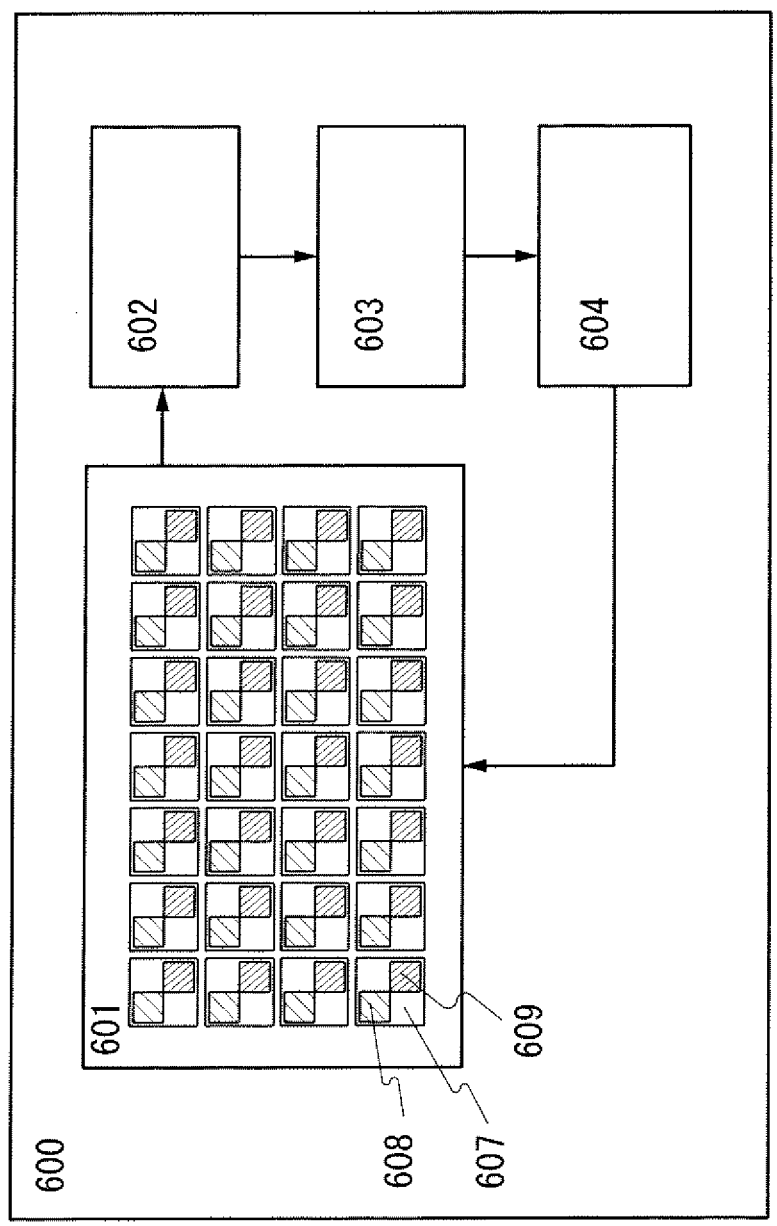
FIG. 6 illustrates a structure of a display panel.

FIG. 6 is an example of a display device 600 including a display panel in this embodiment.

The display device 600 includes a display panel 601, an A/D converter 602, a bit count measurement portion 603, and a controller 604, as in FIG. 1.

What is different from FIG. 1 is that a light-emitting element is included in the display element 608 and that the light-emitting element serves as a light source without the backlight portion 105.

The display panel 601 has a function of displaying an image. Voltage is applied to the light-emitting element included in the display element 608 of each pixel 607 and a desired pixel emits light; thus, an image is displayed.

Further, the display panel 601 has a function of capturing an image of an object, namely a scanning function. Capturing an image is performed in the following manner. Light is emitted from the display element 608 to the object when the object touches or approaches the display panel 601. Then, the emitted light is reflected by the object and enters the photosensor 609 provided in each pixel 607. The photosensor 609 generates current in accordance with luminance of the received light and image data of the object is obtained as an electrical signal.

In this embodiment, as in Embodiments 1 and 2, image data of the captured image is digitized in the A/D converter 602, a bit count number of each bit is measured by the bit count measurement portion 603, and the controller 604 adjusts light from the light source; thus, light which is suitable for sensitivity of the photosensor 609 can be emitted.

Adjustment of light from the light source in this embodiment is performed by adjusting luminance of the light-emitting element. Voltage applied to the light-emitting element may be controlled by the controller 604 so that the light-emitting element emits light with luminance suitable for the sensitivity of the photosensor 609.

A method for measuring the bit count number and a method for judging intensity (luminance) of light entering the photosensor can be similar to those described in Embodiments 1 and 2.

As described above, accuracy of capturing an image can be improved and thus a precise and clear image can be obtained.

This embodiment can be implemented in appropriate combination with any of the other embodiments.

(Embodiment 4)

In this embodiment, a structure of a display panel will be described with reference to FIG. 7. In this embodiment, a display element includes a liquid crystal element and a backlight is provided as a light source.

Figure 7:
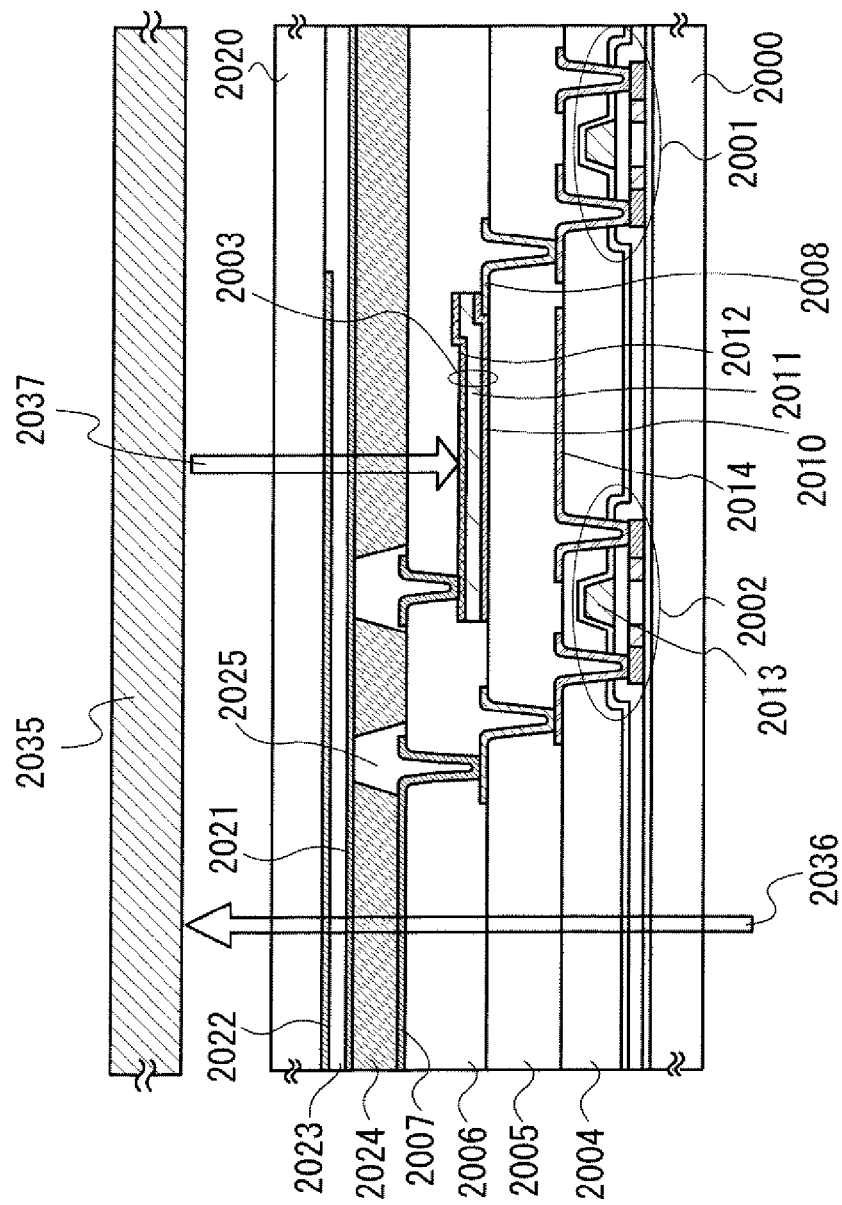
FIG. 7 is a cross-sectional view of a display panel.

FIG. 7 is an example of a cross section of the display device described in Embodiments 1 and 2. A state in which light from a backlight is reflected by an object 2035 and the light enters a photosensor 2003 is shown. As the object 2035, a finger, paper, or the like can be used.

As a substrate 2000, a light-transmitting substrate such as a glass substrate or a quartz substrate is used. A thin film transistor 2001, a thin film transistor 2002, and the photosensor 2003 are provided over the substrate 2000. The photosensor 2003 is formed by stacking an n-type semiconductor layer 2010, an i-type semiconductor layer 2011, and a p-type semiconductor layer 2012 in that order. The n-type semiconductor layer 2010 contains an impurity element imparting one conductivity type (e.g., phosphorus). The i-type semiconductor layer 2011 is an intrinsic semiconductor. The p-type semiconductor layer 2012 contains an impurity element imparting one conductivity type (e.g. boron).

In FIG. 7, top gate thin film transistors are used as the thin film transistors 2001 and 2002; however, this embodiment is not limited to this. As the thin film transistors 2001 and 2002, bottom gate thin film transistors may also be used. Further, the photosensor 2003 has a structure where the n-type semiconductor layer 2010, the i-type semiconductor layer 2011, and the p-type semiconductor layer 2012 are provided; however, this embodiment is not limited to this.

In this embodiment, a crystalline semiconductor layer can be used as each semiconductor layer included in the thin film transistors 2001 and 2002. For example, polycrystalline silicon can be used, but the present invention is not limited to this. Amorphous silicon, microcrystalline silicon, single crystal silicon, an organic semiconductor such as pentacene, an oxide semiconductor, or the like may be used as semiconductor layers included in the thin film transistors 2001 and 2002. In order that a semiconductor layer of single crystal silicon is formed over the substrate 2000, the substrate 2000 is bonded to a single crystal silicon substrate in which a damaged region is provided at a predetermined depth from the surface, and the single crystal silicon substrate is separated at the damaged region. As the oxide semiconductor, a composite oxide of an element selected from indium, gallium, aluminum, zinc, and tin can be used.

An insulating layer 2004 is provided so as to cover the thin film transistors 2001 and 2002. An insulating layer 2005 is provided over the insulating layer 2004, and an insulating layer 2006 is provided over the insulating layer 2005. A pixel electrode 2007 is provided over the insulating layer 2006, and the photosensor 2003 and a lower electrode 2008 are provided over the insulating layer 2005. With to the lower electrode 2008, the photosensor 2003 and the thin film transistor 2001 are electrically connected to each other through an opening portion provided in the insulating layer 2005.

In addition, a counter substrate 2020 is provided with a counter electrode 2021, a color filter layer 2022, and an overcoat layer 2023. The counter substrate 2020 and the substrate 2000 are fixed to each other with a sealant, and the substrates are kept at a substantially constant distance by a spacer 2025. A liquid crystal layer 2024 is sandwiched between the pixel electrode 2007 and the counter electrode 2021, whereby a liquid crystal element is formed.

The color filter layer 2022 may be provided so as to overlap with both the photosensor 2003 and the pixel electrode 2007 as illustrated in FIG. 7.

The photosensor 2003 overlaps with a gate electrode 2013 of the thin film transistor 2002 as illustrated in FIG. 7 and is preferably provided so as to overlap with a signal line 2014 of the thin film transistor 2002 as well.

A backlight is provided for a liquid crystal display device of this embodiment. In FIG. 7, the backlight is provided on the substrate 2000 side, and light is emitted from the backlight in a direction indicated by an arrow 2036. The light emitted from the backlight is reflected by the object 2035 in a direction indicated by an arrow 2037. The reflected light enters the photosensor 2003. As the backlight, a cold cathode fluorescent lamp (CUT) or a white light-emitting diode can be used. A white light-emitting diode is preferable because the adjustable range of luminance is wider than that of a cold-cathode fluorescent lamp.

Further, the brightness (luminance) of the backlight can be adjusted by providing the photosensor 2003, for example, also in a driver circuit portion, for detecting ambient light so that display which is appropriate for the usage environment can be realized.

A backlight is not limited to the above structure. For example, light-emitting diodes (LEDs) of RGB may be used to form a backlight, or color display may be performed in a field sequential method with sequentially lighting of LED backlights of RGB. A color filter layer is not necessary in that case.

Here, an example of a method for manufacturing the liquid crystal display device illustrated in FIG. 7 is briefly described.

First, top gate thin film transistors each including a crystalline semiconductor layer as an active layer are formed. Here, the thin film transistor 2002 including the gate electrode 2013 and the thin film transistor 2001 which is electrically connected to the photosensor 2003 are formed over the same substrate. An n-type thin film transistor or a p-type thin film transistor can be used as each transistor. Further, a storage capacitor can be formed through the same process as these transistors. Note that the storage capacitor may include the semiconductor layer as a lower electrode, a capacitor wiring as an upper electrode, and an insulating film which is formed in the same step as a gate insulating film of the thin film transistors 2001 and 2002 as a dielectric.

Further, contact holes are formed in the insulating layer 2004 which is one of interlayer insulating layers of the thin film transistors, and a source electrode or a drain electrode which is electrically connected to the semiconductor layer of each of the thin film transistors, or a connection electrode which is electrically connected to an upper wiring is formed. Moreover, a signal line of the thin film transistor 2001, which is electrically connected to the photosensor 2003, is formed in the same step. Further, the signal line 2014 of the thin film transistor 2002 is also formed in the same step.

Next, the insulating layer 2005 which covers the signal line 2014 is formed. Note that in this embodiment, since a transmissive liquid crystal display device is shown as an example, the insulating layer 2005 is formed using an insulating material through which visible light can pass. Then, contact holes are formed in the insulating layer 2005, and the lower electrode 2008 is formed over the insulating layer 2005.

Then, the photosensor 2003 is formed so as to overlap with at least part of the lower electrode 2008. The lower electrode 2008 is an electrode for electrically connecting the photosensor 2003 and the thin film transistor 2001. The photosensor 2003 is formed by stacking the n-type semiconductor layer 2010, the i-type semiconductor layer 2011, and the p-type semiconductor layer 2012 in that order. In this embodiment, microcrystalline silicon containing phosphorus, amorphous silicon, and microcrystalline silicon containing boron are stacked as the n-type semiconductor layer 2010, the i-type semiconductor layer 2011, and the p-type semiconductor layer 2012, respectively, by a plasma CVD method.

Next, the insulating layer 2006 which covers the photosensor 2003 is formed. In the case of a transmissive liquid crystal display device, the insulating layer 2006 is formed using an insulating material through which visible light can pass. Then, contact holes are formed in the insulating layer 2006, and the pixel electrode 2007 is formed over the insulating layer 2006. A wiring is formed from the same layer as the pixel electrode 2007. The wiring is electrically connected to the p-type semiconductor layer 2012 which is an upper electrode of the photosensor 2003.

Next, the spacer 2025 is formed over the insulating layer 2006. Although a columnar spacer (a post spacer) is provided as the spacer 2025 in FIG. 7, a spherical spacer (a bead spacer) may be used.

Then, when a TN liquid crystal or the like is used as the liquid crystal layer 2024, an alignment film is formed over the pixel electrode 2007 by coating, and rubbing treatment is performed.

Meanwhile, the color filter layer 2022, the overcoat layer 2023, and the counter electrode 2021 are formed over the counter substrate 2020. Then, an alignment film is formed over the counter electrode 2021 by coating, and rubbing treatment is performed.

After that, a surface of the substrate 2000, over which the alignment film is formed by coating, and a surface of the counter substrate 2020, over which the alignment film is formed by coating, are attached to each other with a sealant. A liquid crystal is placed between these substrates by a liquid crystal dropping method or a liquid crystal injection method, whereby the liquid crystal layer 2024 is formed.

Note that a liquid crystal exhibiting a blue phase for which an alignment film is not necessary may be used for the liquid crystal layer 2024. A blue phase is one of liquid crystal phases, which appears just before a cholesteric phase changes into an isotropic phase while temperature of a cholesteric liquid crystal is increased. Since the blue phase appears only in a narrow temperature range, a liquid crystal composition in which 5 wt. % or more of a chiral material is mixed is used for the liquid crystal layer 2024 in order to broaden the temperature range. As for the liquid crystal composition which contains a liquid crystal exhibiting a blue phase and a chiral material, the response speed is as high as 10 μs to 100 μs, alignment treatment is not necessary due to optical isotropy, and viewing angle dependence is low.

This embodiment can be implemented in appropriate combination with any of the embodiments.

(Embodiment 5)

Figure 8:
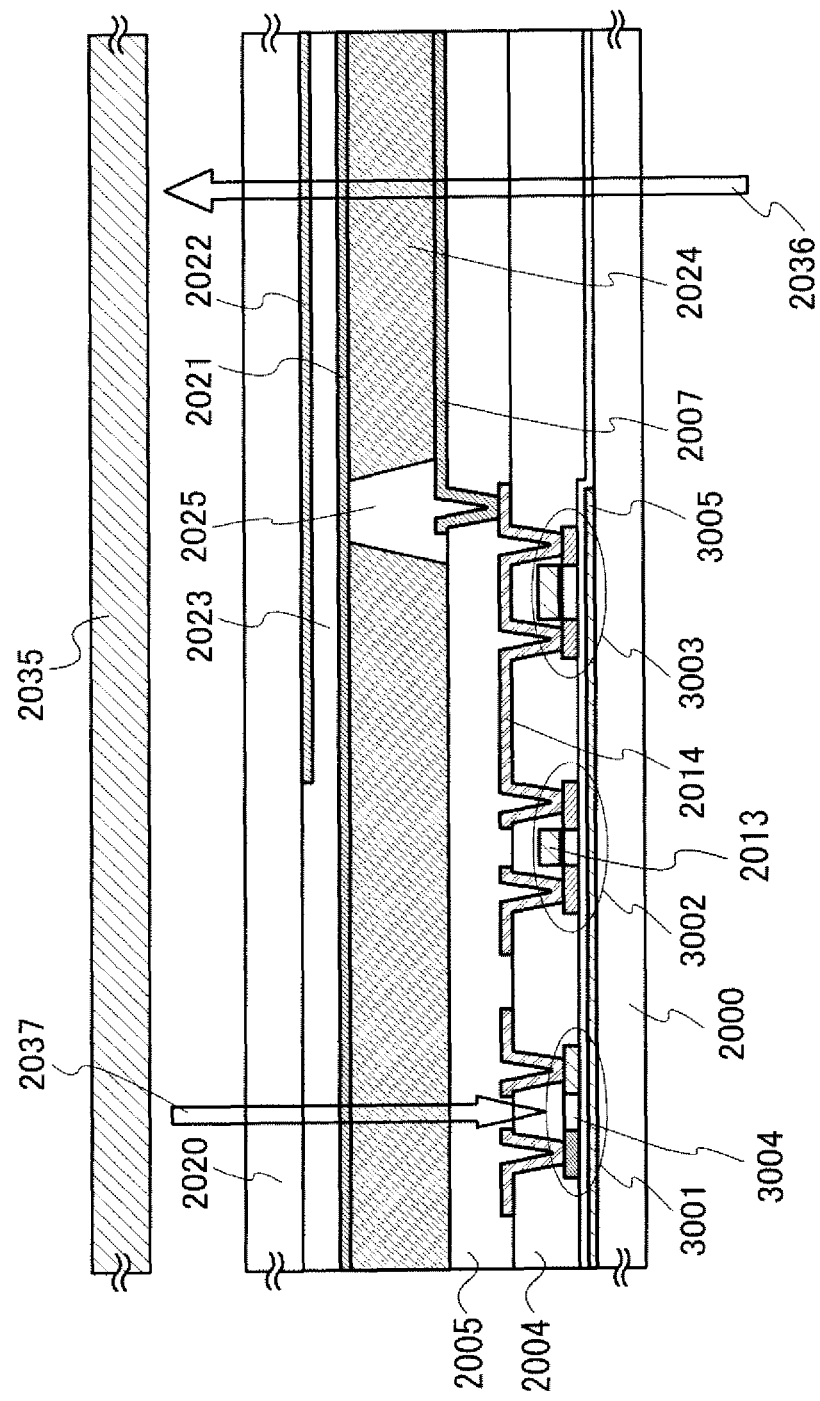
FIG. 8 is a cross-sectional view of a display panel.

Another example of a cross-sectional view of a display panel is illustrated in FIG. 8. A display panel illustrated in FIG. 8 is provided with a photosensor 3001, a thin film transistor 3002, and a storage capacitor 3003 over the substrate 2000.

The photosensor 3001 and the storage capacitor 3003 can be formed at the same time as the thin film transistor 3002 is formed in a manufacturing process of the thin film transistor 3002. That is, semiconductor films included in the photosensor 3001, the storage capacitor 3003, and the thin film transistor 3002 are formed in the same layer, and the number of manufacturing steps can be reduced.

The photosensor 3001 is a lateral-junction PIN photodiode. A semiconductor film 3004 included in the photosensor 3001 has a region having p-type conductivity (p-type layer), a region having i-type conductivity (i-type layer), and a region having n-type conductivity (n-type layer).

Note that although the case where the photosensor 3001 is a PIN photodiode is described in this embodiment, the photosensor 3001 may be a PN photodiode. Lateral PIN junction or lateral PN junction can be formed by adding an impurity imparting p-type conductivity and an impurity imparting n-type conductivity to respective particular regions in the semiconductor film 3004.

The photosensor 3001 does not necessarily have lateral junction; a p-type layer, an i-type layer, and an n-type layer may be stacked.

Further, as in Embodiment 4, a backlight is provided on the substrate 2000 side and light is emitted from the backlight in a direction indicated by the arrow 2036.

When a light-blocking film 3005 is formed below the photosensor 3001, light from the substrate 2000 side can be blocked and accuracy of capturing an image can be improved. An organic resin containing black colorant such as carbon black or titanium lower oxide can be used for the light-blocking film 3005. Alternatively, a film of chromium can be used as the light-blocking film 3005.

The description of the other structure is omitted since it is similar to that of Embodiment 4.

This embodiment can be implemented in appropriate combination with any of the other embodiments.

(Embodiment 6)

Figure 9:
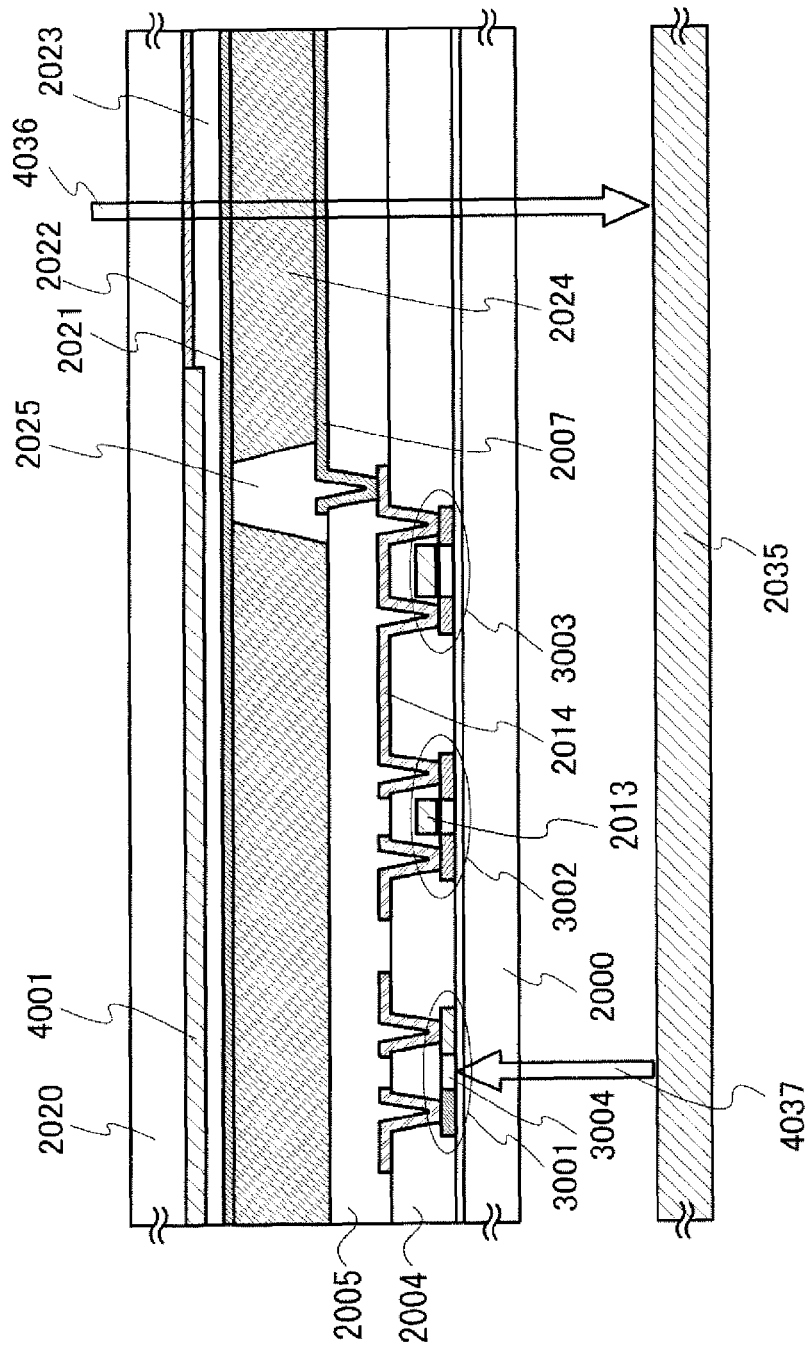
FIG. 9 is a cross-sectional view of a display panel.

Another example of a cross-sectional view of a display panel is illustrated in FIG. 9. As in Embodiment 5, the photosensor 3001, the thin film transistor 3002, and the storage capacitor 3003 are provided over the substrate 2000.

What is different from Embodiment 5 is that the object 2035 approaches or touches from the substrate 2000 side, and that a backlight is provided on the counter substrate 2020 side, light is emitted from the backlight in a direction indicated by an arrow 4036, and light reflected by the object 2035 enters the photosensor 3001 as indicated by an arrow 4037.

In this case, with a light-blocking film 4001 provided above the photosensor 3001, light from the counter substrate 2020 side can be blocked and thus accuracy of capturing an image can be improved. An organic resin containing black colorant such as carbon black or titanium lower oxide can be used for the light-blacking film 4001. Alternatively, a film of chromium can be used for the light-blocking film 4001.

Although the photosensor 3001 has lateral junction in FIG. 9, the photosensor 3001 may have a structure in which a p-type layer, an i-type layer, and an n-type layer are stacked.

This embodiment can be implemented in appropriate combination with any of the other embodiments.

(Embodiment 7)

Figure 10:
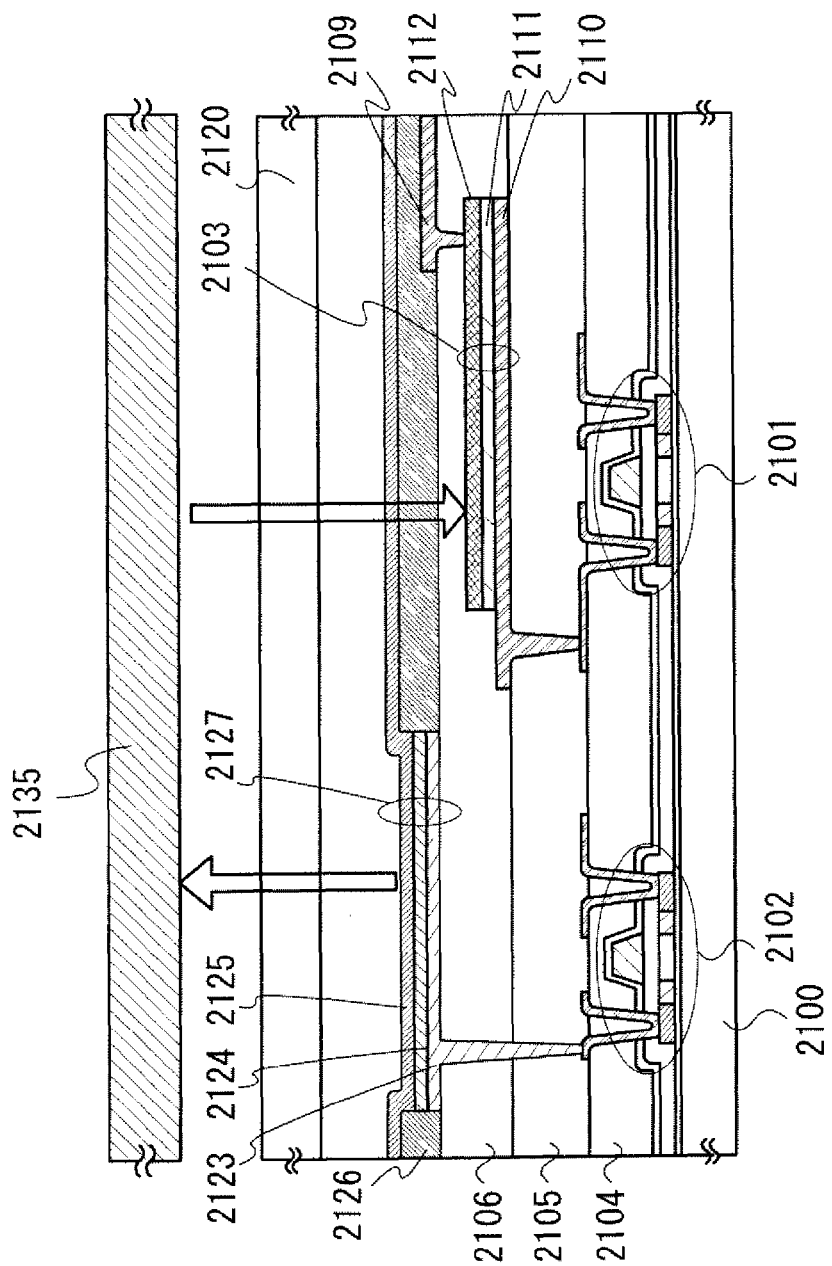
FIG. 10 is a cross-sectional view of a display panel.

A display device in which a display element includes a light-emitting element is illustrated in FIG. 10.

In a display device including a light-emitting element, the light-emitting element serves as a light source and light is emitted to an object.

FIG. 10 illustrates an example of a cross-sectional view of an EL display element using an EL element (e.g., an organic EL element, an inorganic EL element, or an EL element including an organic substance and an inorganic substance) as a light-emitting element in the display panel described in Embodiment 5. A state in which light emitted from an EL element 2127 is reflected by an object 2135 and the light enters a photosensor 2103 is shown.

In FIG. 10, a thin film transistor 2101, a thin film transistor 2102, and the photosensor 2103 are provided over a substrate 2100. The photosensor 2103 is formed by stacking an n-type semiconductor layer 2110, an i-type semiconductor layer 2111, and a p-type semiconductor layer 2112. A counter substrate 2120 is fixed to the substrate 2100 by a sealant.

An insulating layer 2104 is provided so as to cover the thin film transistors 2101 and 2102. An insulating layer 2105 is provided over the insulating layer 2104, and an insulating layer 2106 is provided over the insulating layer 2105. The EL element 2127 is provided over the insulating layer 2106, and the photosensor 2103 is provided over the insulating layer 2105. With the n-type semiconductor layer 2110 of the photosensor 2103, the photosensor 2103 and the thin film transistor 2101 are electrically connected to each other through an opening portion provided in the insulating layer 2105.

Further, a sensor wiring 2109 electrically connects the p-type semiconductor layer 2112 and another wiring.

The EL element 2127 is formed by stacking a pixel electrode 2123, a light-emitting layer 2124, and a counter electrode 2125 in that order. Note that light-emitting layers of adjacent pixels are separated by a bank 2126.

Either an n-type thin film transistor or a p-type thin film transistor can be used as each of the thin film transistor 2101 and the thin film transistor 2102. In the case where the pixel electrode 2123 functions as a cathode, the thin film transistor 2102 which is electrically connected to the pixel electrode 2123 is preferably an n-type thin film transistor in considering the direction of current. Alternatively, in the case where the pixel electrode 2123 functions as an anode, the thin film transistor 2102 is preferably a p-type thin film transistor.

Although the photosensor 2103 is provided above the thin film transistor 2101 in FIG. 10, the photosensor 2103 may be formed in the same layer as the thin film transistor 2101. Accordingly, the photosensor 2103, the thin film transistor 2101, and the thin film transistor 2102 can be formed in the same process. In that case, the photosensor 2103 preferably has lateral junction.

This embodiment can be implemented in appropriate combination with any of the other embodiments.

(Embodiment 8)

In this embodiment, examples of electronic devices will be described with reference to FIGS. 11A to 11D.

Figure 11A:
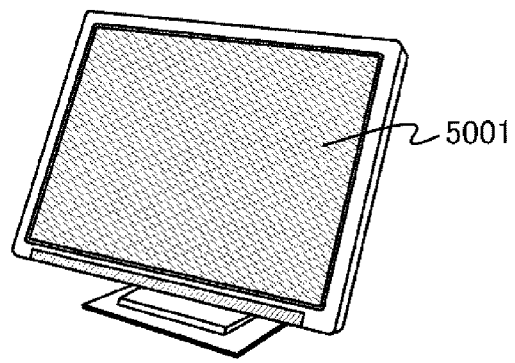
FIGS. 11A to 11D each illustrate an electronic device.
Figure 11B:
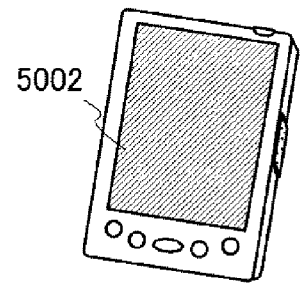
Figure 11C:
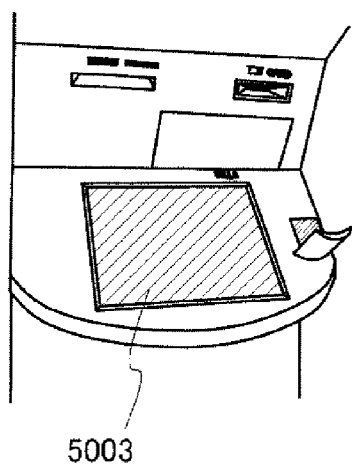
Figure 11D:
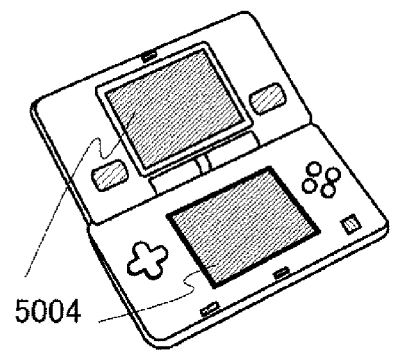

FIG. 11A illustrates a display device. The display device includes any of display devices for displaying information, such as those for personal computers, television broadcast reception, and advertisement display. FIG. 11B illustrates a portable information terminal. FIG. 11C illustrates an automated teller machine. FIG. 11D illustrates a portable game machine. The display panel according to one embodiment of the present invention can be used for each of display portions 5001 to 5004 of the electronic devices in FIGS. 11A to 11D.

The present invention can be applied to a device which does not necessarily have a display panel, such as a fingerprint authentication device. The device includes an input portion provided with a photosensor. An object which touches or approaches the input portion can be detected by the photosensor.

This embodiment can be implemented in appropriate combination with any of the other embodiments.

(Embodiment 9)

In this embodiment, an example of an electronic device will be described with reference to FIG. 12.

Figure 12:
FIG. 12 illustrates an electronic device.

FIG. 12 illustrates a writing board (e.g., a black board and a white board). An input portion such as a display panel according to one embodiment of the present invention can be provided in a writing portion 9101 of a main body 9001.

Here, it is possible to write freely on a surface of the writing portion 9101 with a marker pen or the like.

Note that it is easy to erase letters if the letters are written with a marker pen or the like without fixer.

Moreover, a surface of the writing portion 9101 may be sufficiently smooth so that ink of a marker pen is easily erased.

For example, when the surface of the writing portion 9101 is a glass substrate or the like, the smoothness is sufficient.

Further, a transparent synthetic resin sheet or the like may be attached to the surface of the writing portion 9101.

As the synthetic resin, acrylic or the like is preferably used. In this case, the surface of the synthetic resin sheet is preferably smooth.

Further, when the writing portion 9101 performs specific display, the user can draw or write on the surface. Furthermore, the writing portion 9101 can superimpose a displayed image with the drawing or the letter.

Furthermore, since a photosensor is used, sensing is possible even after time has passed after drawing or writing is performed. When a resistive touch sensor, a capacitance touch sensor, or the like is used, sensing can be performed only at the same time as drawing or writing is performed.

This embodiment can be implemented in appropriate combination with any of the other embodiments.

This application is based on Japanese Patent Application serial no. 2009-245532 filed with Japan Patent Office on Oct. 26, 2009, the entire contents of which are hereby incorporated by reference.

What is claimed is:

1. A semiconductor device comprising:
   a photosensor;
   a light source; and
   a controller,
   wherein the light source is configured to irradiate paper with light,
   wherein the photosensor is configured to detect the light reflected by the paper, and
   wherein the controller is configured to lower the luminance of the light from the light source when the luminance of the light detected by the photosensor is higher than a first value and to increase the luminance of the light from the light source when the luminance of the light detected by the photosensor is lower than a second value.

2. The semiconductor device according to claim 1, wherein the light source comprises an LED.

3. The semiconductor device according to claim 1, further comprising:
   an A/D converter configured to convert data of the paper into a digital signal; and
   a bit count measurement portion configured to count a bit count number of each bit of the digital signal.

4. The semiconductor device according to claim 1, further comprising a pixel electrode for displaying an image, wherein the light source is configured to irradiate the paper with the light through the pixel electrode.

5. The semiconductor device according to claim 4, further comprising a thin film transistor,
   wherein the thin film transistor is electrically connected to the pixel electrode, and
   wherein the photosensor and the thin film transistor overlap with each other.

6. A semiconductor device comprising:
   an input portion comprising a photosensor;
   a light source;
   an A/D converter;
   a bit count measurement portion; and
   a controller,
   wherein the light source is configured to irradiate paper with light,
   wherein the input portion is configured to capture data of the paper by receiving the light reflected from the paper by the photosensor,
   wherein the A/D converter is configured to convert the data of the paper into a digital signal,
   wherein the bit count measurement portion is configured to count a bit count number of each bit of the digital signal, and
   wherein the controller is configured to lower the luminance of the light from the light source when the bit count number is higher than a first value and to increase the luminance of the light from the light source when the bit count number is lower than a second value.

7. The semiconductor device according to claim 6, wherein the light source comprises an LED.

8. The semiconductor device according to claim 6, wherein the data of the paper is image data.

9. The semiconductor device according to claim 6, further comprising a pixel electrode for displaying an image, wherein the light source is configured to irradiate the paper with the light through the pixel electrode.

10. The semiconductor device according to claim 9, further comprising a thin film transistor,
    wherein the thin film transistor is electrically connected to the pixel electrode, and
    wherein the photosensor and the thin film transistor overlap with each other.

11. The semiconductor device according to claim 6, wherein the controller is configured to adjust luminance of the light from the light source so that the bit count number of a central bit is the highest.

12. The semiconductor device according to claim 6, wherein the controller is configured to adjust luminance of the light from the light source so that an average of the bit count number comes to a medium value of a maximum value of the bit count number.

13. A display device comprising:
    a display panel comprising a display element and a photosensor;
    a backlight;
    an A/D converter;
    a bit count measurement portion; and
    a controller,
    wherein the backlight is configured to irradiate paper with light,
    wherein the display panel is configured to capture data of the paper by receiving the light reflected from the paper by the photosensor,
    wherein the A/D converter is configured to convert the data of the paper into a digital signal, wherein the bit count measurement portion is configured to count a bit count number of each bit of the digital signal, and wherein the controller is configured to lower the luminance of the light from the backlight when the bit count number is higher than a first value and to increase the luminance of the light from the backlight when the bit count number is lower than a second value.

14. The display device according to claim 13, wherein the backlight comprises an LED.

15. The display device according to claim 13, wherein the data of the paper is image data.

16. The display device according to claim 13, further comprising a pixel electrode for displaying an image, wherein the backlight is configured to irradiate the paper with the light through the pixel electrode.

17. The display device according to claim 16, further comprising a thin film transistor,
wherein the thin film transistor is electrically connected to the pixel electrode, and
wherein the photosensor and the thin film transistor overlap with each other.

18. The display device according to claim 13, wherein the controller is configured to adjust luminance of the light from the backlight so that the bit count number of a central bit is the highest.

19. The display device according to claim 13, wherein the controller is configured to adjust luminance of the light from the backlight so that an average of the bit count number comes to a medium value of a maximum value of the bit count number.

20. The display device according to claim 13, wherein the display element is a liquid crystal element or an EL element.

21. A semiconductor device comprising:
a photosensor;
a light source; and
a controller,
wherein the light source is configured to irradiate a human finger with light,
wherein the photosensor is configured to detect the light reflected by the human finger, and
wherein the controller is configured to lower the luminance of the light from the light source when the luminance of the light detected by the photosensor is higher than a first value and to increase the luminance of the light from the light source when the luminance of the light detected by the photosensor is lower than a second value.

22. The semiconductor device according to claim 21, wherein the light source comprises an LED.

23. The semiconductor device according to claim 21, further comprising:
an A/D converter configured to convert data of the human finger into a digital signal; and
a bit count measurement portion configured to count a bit count number of each bit of the digital signal.

24. The semiconductor device according to claim 21, further comprising a pixel electrode for displaying an image, wherein the light source is configured to irradiate the human finger with the light through the pixel electrode.

25. The semiconductor device according to claim 24, further comprising a thin film transistor,
wherein the thin film transistor is electrically connected to the pixel electrode, and
wherein the photosensor and the thin film transistor overlap with each other.

26. A semiconductor device comprising:
a light source;
a first substrate over the light source;
a photosensor over the first substrate;
a second substrate over the photosensor; and
a controller,
wherein the semiconductor device is configured such that light from the light source enters through the first substrate and exits from the second substrate,
wherein the semiconductor device is configured such that light from the second substrate enters the photosensor and is detected by the photosensor, and
wherein the controller is configured to lower the luminance of the light from the light source when the luminance of the light detected by the photosensor is higher than a first value and to increase the luminance of the light from the light source when the luminance of the light detected by the photosensor is lower than a second value.

27. The semiconductor device according to claim 26, wherein the light source comprises an LED.

28. The semiconductor device according to claim 26, further comprising:
an A/D converter configured to convert data of the light detected by the photosensor into a digital signal; and
a bit count measurement portion configured to count a bit count number of each bit of the digital signal.

29. The semiconductor device according to claim 26, further comprising a pixel electrode for displaying an image, wherein the light from the light source exits from the second substrate through the pixel electrode.

30. The semiconductor device according to claim 29, further comprising a thin film transistor,
wherein the thin film transistor is electrically connected to the pixel electrode, and
wherein the photosensor and the thin film transistor overlap with each other.

31. The semiconductor device according to claim 1,
wherein a light-emitting element serves as the light source, and
wherein the semiconductor device has a function of displaying an image by applying voltage to the light-emitting element.

32. The semiconductor device according to claim 6,
wherein a light-emitting element serves as the light source, and
wherein the semiconductor device has a function of displaying an image by applying voltage to the light-emitting element.

33. The semiconductor device according to claim 21,
wherein a light-emitting element serves as the light source, and
wherein the semiconductor device has a function of displaying an image by applying voltage to the light-emitting element.

34. The semiconductor device according to claim 26,
wherein a light-emitting element serves as the light source, and
wherein the semiconductor device has a function of displaying an image by applying voltage to the light-emitting element.

* * * * *